(12) United States Patent
Nishida et al.

(10) Patent No.: US 9,538,650 B2
(45) Date of Patent: Jan. 3, 2017

(54) WIRING BOARD HAVING AN OPENING WITH AN ANGLED SURFACE

(71) Applicant: NGK SPARK PLUG CO., LTD., Nagoya-shi, Aichi (JP)

(72) Inventors: Tomohiro Nishida, Mizuho (JP); Seiji Mori, Kounan (JP); Makoto Wakazono, Niwa-gun (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 14/416,116

(22) PCT Filed: Aug. 23, 2013

(86) PCT No.: PCT/JP2013/004972
§ 371 (c)(1),
(2) Date: Jan. 21, 2015

(87) PCT Pub. No.: WO2014/030355
PCT Pub. Date: Feb. 27, 2014

(65) Prior Publication Data
US 2015/0223332 A1    Aug. 6, 2015

(30) Foreign Application Priority Data

Aug. 24, 2012  (JP) ................................ 2012-184962
Nov. 27, 2012  (JP) ................................ 2012-258208

(51) Int. Cl.
*H05K 1/11*    (2006.01)
*H01L 21/56*   (2006.01)
(Continued)

(52) U.S. Cl.
CPC ............. *H05K 1/11* (2013.01); *H01L 21/563* (2013.01); *H01L 23/145* (2013.01);
(Continued)

(58) Field of Classification Search
USPC .................. 174/252, 250, 261, 255, 258
See application file for complete search history.

(56) References Cited

U.S. PATENT DOCUMENTS 6,228,466 B1 *  5/2001  Tsukada ............ H01L 23/49816
                                                        174/255
6,809,415 B2 * 10/2004  Tsukada ............... H05K 3/3452
                                                        174/257
(Continued)

FOREIGN PATENT DOCUMENTS

EP       0 997 935 A1      5/2000
JP       2004-342989 A    12/2004
(Continued)

OTHER PUBLICATIONS

European Patent Office, Extended European Search Report, issued in corresponding Application No. EP 13 83 0722, mailed Nov. 18, 2015.

(Continued)

*Primary Examiner* — Timothy Thompson
*Assistant Examiner* — Michael F McAllister
(74) *Attorney, Agent, or Firm* — Stites & Harbison, PLLC; Jeffrey A. Haeberlin; James R. Hayne

(57) ABSTRACT

In a wiring substrate, formation of voids due to underfill filling failure is suppressed. A wiring substrate includes an insulating base layer, an insulating layer laminated on the base layer, and an electrically conductive connection terminal projecting from the insulating layer inside an opening. The insulating layer has a first surface with an opening, and a second surface located within the opening and being concave toward the base layer in relation to the first surface. The second surface extends from the first surface to the connection terminal inside the opening. On a cut surface which is a flat surface extending along a lamination direction in which the insulating layer is laminated on the base layer, (Continued)

an angle which is larger than 0° but smaller than 90° is formed between a normal line extending from an arbitrary point on the second surface toward the outside of the insulating layer and a parallel line extending from the arbitrary point toward the connection terminal in parallel to the first surface.

3 Claims, 3 Drawing Sheets

(51) Int. Cl.

| | | |
|---|---|---|
| *H01L 23/14* | (2006.01) | |
| *H01L 23/498* | (2006.01) | |
| H01L 23/12 | (2006.01) | |
| H01L 23/13 | (2006.01) | |
| H01L 23/00 | (2006.01) | |
| H05K 3/34 | (2006.01) | |

(52) U.S. Cl.
CPC ........ *H01L 23/49894* (2013.01); *H01L 24/32* (2013.01); *H01L 24/73* (2013.01); *H01L 24/83* (2013.01); *H05K 1/111* (2013.01); *H05K 3/3452* (2013.01); H01L 23/12 (2013.01); H01L 23/13 (2013.01); H01L 24/11 (2013.01); H01L 24/13 (2013.01); H01L 24/16 (2013.01); H01L 24/29 (2013.01); H01L 24/81 (2013.01); H01L 2224/1161 (2013.01); H01L 2224/131 (2013.01); H01L 2224/13113 (2013.01); H01L 2224/16238 (2013.01); H01L 2224/2919 (2013.01); H01L 2224/32237 (2013.01); H01L 2224/73204 (2013.01); H01L 2224/81193 (2013.01); H01L 2224/81385 (2013.01); H01L 2224/81447 (2013.01); H01L 2224/81815 (2013.01); H01L 2224/8385 (2013.01); H01L 2224/83102 (2013.01); H01L 2224/83385 (2013.01); H01L 2924/3512 (2013.01); H01L 2924/3841 (2013.01); H05K 3/3436 (2013.01); H05K 2201/09018 (2013.01); H05K 2201/10977 (2013.01); H05K 2203/0594 (2013.01); H05K 2203/0597 (2013.01); Y02P 70/611 (2015.11)

(56) References Cited

U.S. PATENT DOCUMENTS

| | | | |
|---|---|---|---|
| 6,911,604 B2 * | 6/2005 | Tsai | ................ H01L 23/49816 174/255 |
| 8,017,975 B2 * | 9/2011 | Murayama | .......... H01L 21/8248 257/183 |
| 8,169,083 B2 | 5/2012 | Igarashi | |
| 8,222,539 B2 * | 7/2012 | Kawamura | ............. H01L 24/24 174/255 |
| 2001/0014523 A1 | 8/2001 | Bessho | |
| 2001/0042637 A1 * | 11/2001 | Hirose | ................. B23K 26/386 174/255 |
| 2002/0081830 A1 | 6/2002 | Bessho | |
| 2005/0258551 A1 | 11/2005 | Ho et al. | |
| 2008/0179740 A1 * | 7/2008 | Liao | ................. H01L 23/49816 257/738 |
| 2009/0027864 A1 | 1/2009 | Cho et al. | |
| 2010/0155965 A1 | 6/2010 | Igarashi | |
| 2011/0036620 A1 * | 2/2011 | Lin | ....................... H05K 1/116 174/256 |
| 2011/0297425 A1 | 12/2011 | Nakamura et al. | |

FOREIGN PATENT DOCUMENTS

| | | | |
|---|---|---|---|
| JP | 2007-059588 A | 3/2007 | |
| JP | 2007-103648 A | 4/2007 | |
| JP | 2008-021883 A | 1/2008 | |
| JP | 2009-152317 A | 7/2009 | |
| JP | 2010-153495 A | 7/2010 | |
| JP | 2011-192692 A | 9/2011 | |
| JP | 2011-258590 A | 12/2011 | |
| JP | 2012-164934 A | 8/2012 | |
| TW | 318321 B | 10/1997 | |
| WO | WO 9802071 * | 5/1998 | ............... H05K 3/28 |

OTHER PUBLICATIONS

Korean Industrial Property Office, Notification of Provisional Refusal, issued in corresponding Application No. 10-2015-7006916, mailed Jan. 6, 2016.

JPO/ISA, International Search Report in corresponding international application No. PCT/JP2013/004972, mailed Nov. 19, 2013.

Taiwan Patent Office, Office Action cited in corresponding Taiwanese Application No. 102129936, mailed Feb. 22, 2016 (English translation currently unavailable).

* cited by examiner

WIRING BOARD HAVING AN OPENING WITH AN ANGLED SURFACE

TECHNICAL FIELD

The present invention relates to a wiring substrate (board).

BACKGROUND ART

There has been known a wiring substrate on which a semiconductor chip can be mounted (see, for example, Patent Documents 1 and 2). Such a wiring substrate has connection terminals connectable to a semiconductor chip.

Patent Document 1 discloses a technique for preventing plating material from forming an electrical short circuit between connection terminals. According to the technique, an insulating layer having an opening for exposing a plurality of connection terminals is formed, insulation is formed between the connection terminals in the opening, and the connection terminals are plated. Patent Document 2 discloses a technique of thinning an insulating layer formed between connection terminals to a thickness equal to or smaller than the thickness of the connection terminals to thereby prevent solder from forming an electrical short circuit between the connection terminals.

When a semiconductor chip is mounted on a wiring substrate, the connection terminals of the wiring substrate are soldered to the semiconductor chip, and a liquid hardening resin called "underfill" is filled into a gap between the wiring substrate and the semiconductor chip around the connection terminals (see, for example, Patent Document 3).

PRIOR ART DOCUMENTS

Patent Documents

Patent Document 1: Japanese Patent Application Laid-Open (kokai) No. 2007-103648
Patent Document 2: Japanese Patent Application Laid-Open (kokai) No. 2011-192692
Patent Document 3: Japanese Patent Application Laid-Open (kokai) No. 2010-153495

SUMMARY OF THE INVENTION

Problem to be Solved by the Invention

In the techniques disclosed in Patent Documents 1 and 2, sufficient consideration is not given to filling of an underfill around connection terminals, although prevention of formation of a short circuit between connection terminals through plating material or solder is considered. Therefore, the conventional techniques have a problem in that a flow of the underfill is hindered, and voids (hollows) may be formed due to failure to completely fill the underfill. In the technique disclosed in Patent Document 3, sufficient consideration is not given to a flow of an underfill after having entered the gap between a wiring substrate and a semiconductor chip. Therefore, the technique disclosed in Patent Document 3 also has a problem in that voids may be formed due to failure to completely fill the underfill.

Means for Solving the Problem

The present invention has been accomplished so as to solve the above-mentioned problems, and can be realized in the following modes.

(1) According to one mode of the present invention, there is provided a wiring substrate comprising an insulating base layer; an insulating layer laminated on the base layer, the insulating layer having a first surface with an opening, and a second surface located within the opening and being concave toward the base layer in relation to the first surface; and an electrically conductive connection terminal projecting from the insulating layer inside the opening. In the wiring substrate, the second surface extends from the first surface to the connection terminal inside the opening, and on a cut surface which is a flat surface extending along a lamination direction in which the insulating layer is laminated on the base layer, an angle which is larger than 0° but smaller than 90° is formed between a normal line extending outward from an arbitrary point on the second surface and a parallel line extending from the arbitrary point toward the connection terminal in parallel to the first surface. According to the wiring substrate of this mode, an underfill is guided toward the connection terminal by various parts of the second surface, whereby the flow of the underfill can be stabilized. As a result, it is possible to suppress formation of voids which would otherwise be formed due to failure to completely fill the underfill.

(2) In the wiring substrate of the above-described mode, the second surface may be composed of a curved surface. According to the wiring substrate of this mode, the surface area of the second surface which comes into contact with the underfill increases as compared with the case where the second surface is composed of a flat surface. Therefore, the degree of adhesion between the second surface and the underfill can be increased. Also, since the stress of the insulating layer due to hardening of the underfill decreases as compared with the case where the second surface is composed of a flat surface, cracking of the insulating layer can be suppressed.

(3) In the wiring substrate of the above-described mode, the second surface may be composed of a flat surface. According to the wiring substrate of this mode, the distance over which the underfill flows on the second surface becomes shorter as compared with the case where the second surface is composed of a curved surface. Therefore, the time required for filling the underfill can be shortened.

(4) In the wiring substrate of the above-described mode, the second surface may have a surface roughness greater than that of the first surface. According to the wiring substrate of this mode, it is possible to cause the underfill to reach various regions on the second surface through utilization of the capillary action, without hindering the flowability of the underfill.

The present invention can be realized in various forms other than the wiring substrate. For example, the present invention can be realized in the form of an apparatus including a wiring substrate or a manufacturing method for manufacturing a wiring substrate.

MODES FOR CARRYING OUT THE INVENTION

A. First Embodiment

Figure 1:
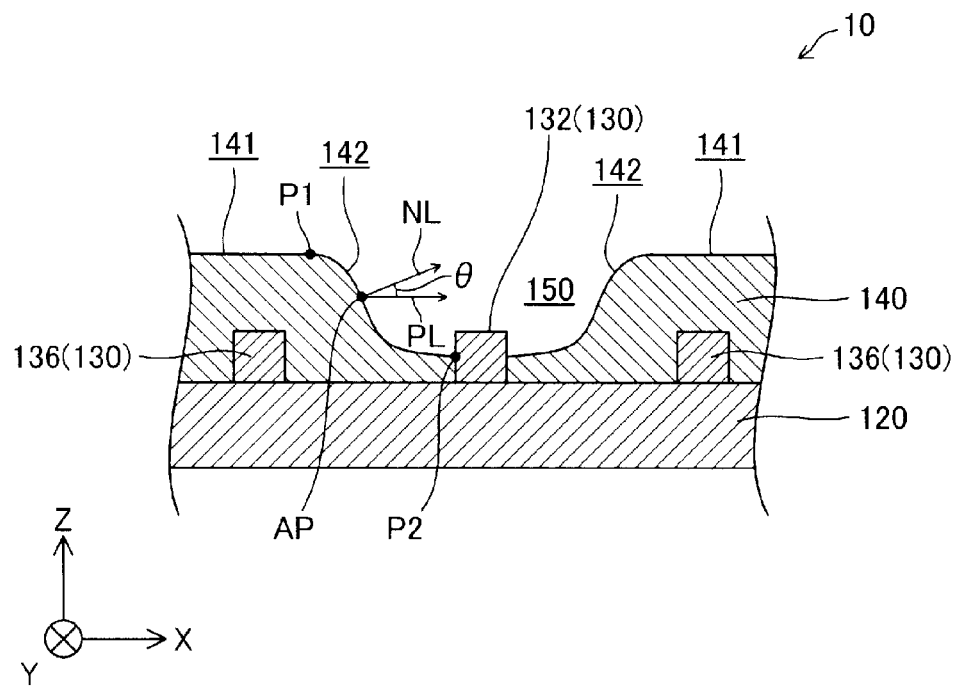
FIG. 1 Partial cross-sectional view schematically showing the structure of a wiring substrate according to a first embodiment.
Figure 2:
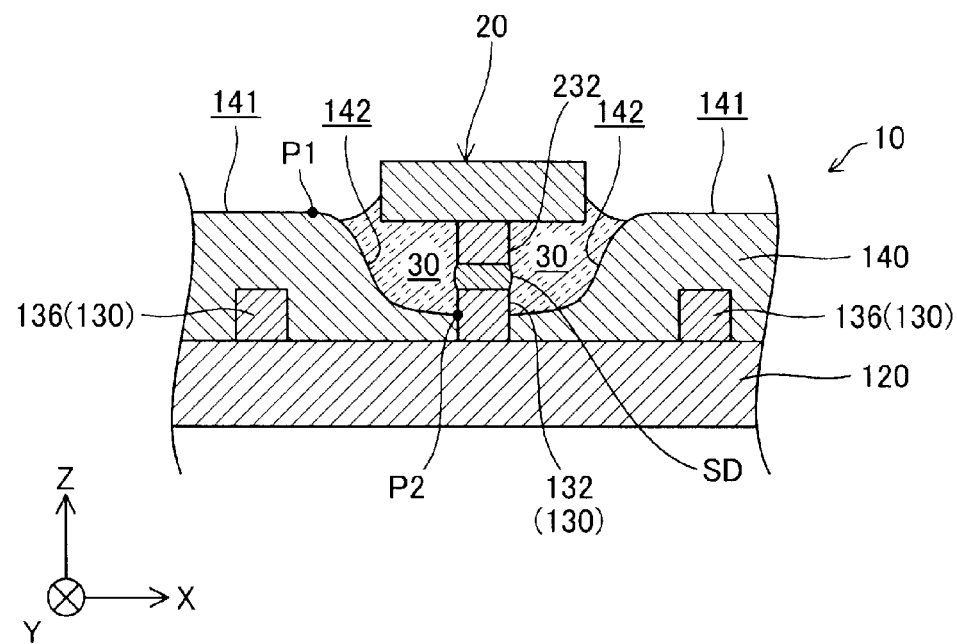
FIG. 2 Partial cross-sectional view schematically showing the structure of the wiring substrate on which a semiconductor chip is mounted.

FIG. 1 is a partial cross-sectional view schematically showing the structure of a wiring substrate 10 according to a first embodiment. FIG. 2 is a partial cross-sectional view schematically showing the structure of the wiring substrate 10 on which a semiconductor chip 20 is mounted. The wiring substrate 10 is a plate-shaped member formed of an organic material, and is also called an "organic substrate." In the present embodiment, as shown in FIG. 2, the wiring substrate 10 is a flip-chip mounting substrate configured such that the semiconductor chip 20 can be mounted thereon.

The wiring substrate 10 includes a base layer 120, a conductor layer 130, and an insulating layer 140. In the present embodiment, the wiring substrate 10 is manufactured by forming the conductor layer 130 on the base layer 120 and then forming the insulating layer 140 thereon. In other embodiments, the wiring substrate 10 may have a multi-layer structure in which a plurality of conductor layers and a plurality of insulating layers are alternatingly laminated on the base layer 120, or may have such a multi-layer structure on each of opposite sides of the base layer 120.

X, Y, and Z axes which perpendicularly intersect with one another are shown in FIG. 1. The X, Y, and Z axes of FIG. 1 correspond to the X, Y, and Z axes in other drawings. Of the X, Y, and Z axes of FIG. 1, the Z axis coincides with a lamination direction in which the insulating layer 140 is laminated on the base layer 120. Of the Z-axis directions along the Z axis, an axial direction from the base layer 120 toward the insulating layer 140 will be referred to as a +Z-axis direction, and an axial direction opposite the +Z-axis direction will be referred to as a −Z-axis direction. Of the X, Y, and Z axes of FIG. 1, the X and Y axes extend along the layer surface perpendicular to the Z axis. In the description of FIG. 1, of the X-axis directions along the X axis, an axial direction from the left side toward the right side of the sheet will be referred to as a +X-axis direction, and an axial direction opposite the +X-axis direction will be referred to as a −X-axis direction. In the description of FIG. 1, of the Y-axis directions along the Y axis, an axial direction from the front side of the sheet toward the back side of the sheet will be referred to as a +Y-axis direction, and an axial direction opposite the +Y-axis direction will be referred to as a −Y-axis direction.

The base layer 120 of the wiring substrate 10 is a plate-shaped member formed of an insulating material. In the present embodiment, the insulating material of the base layer 120 is a thermosetting resin (e.g., bismaleimide-triazine resin (BT), epoxy resin, etc.). In other embodiments, the insulating material of the base layer 120 may be a fiber reinforced resin (e.g., glass-reinforced epoxy resin). Although not illustrated in FIGS. 1 and 2, conductors (for example, through holes, vias, etc.) which partially constitute wiring connected to the conductor layer 130 are formed in the base layer 120.

The conductor layer 130 of the wiring substrate 10 is a conductor pattern which is formed on the base layer 120 and which is made of an electrically conductive material. In the present embodiment, the conductor layer 130 is formed by etching a copper plating layer formed on the surface of the base layer 120 into a desired shape. The conductor layer 130 includes a connection terminal 132 projecting from the insulating layer 140, and an internal wiring 136 covered with the insulating layer 140.

As shown in FIG. 2, the connection terminal 132 of the conductor layer 130 can be connected to a connection terminal 232 of the semiconductor chip 20 via solder SD. In the present embodiment, the surface of the connection terminal 132 is plated.

The insulating layer 140 of the wiring substrate 10 is a layer formed of an insulating material, and is also called "solder resist." The insulating layer 140 has a first surface 141 and a second surface 142.

The first surface 141 of the insulating layer 140 is a surface of the insulating layer 140 on which an opening 150 is formed. In the present embodiment, the first surface 141 is a surface extending along the X axis and the Y axis and facing toward the +Z-axis direction, and forms the surface of the insulating layer 140 on the +Z-axis direction side.

The second surface 142 of the insulating layer 140 is a surface of the insulating layer 140 which is located in the opening 150 and is concave toward the base layer 120 in relation to the first surface 141. The connection terminal 132 of the conductor layer 130 is exposed on the second surface 142. In the present embodiment, the connection terminal 132 projects from the second surface 142 toward the +Z-axis direction side. In the present embodiment, the single connection terminal 132 is provided on the second surface 142. In other embodiments, two or more connection terminals 132 may be provided on the second surface 142.

The cut surface of the wiring substrate 10 in FIG. 1 is a Z-X plane parallel to the Z axis and the X axis. As viewed on the Z-X plane, the second surface 142 extends from a connection point P1 at which the second surface 142 is connected to the first surface 141 to a connection point P2 at which the second surface 142 is connected to the connection terminal 132.

In FIG. 1, a point AP, a normal line NL, a parallel line PL, and an angle θ are illustrated on the Z-X plane. The point AP is an arbitrary point on the second surface 142 extending from the connection point P1 to the connection point P2. The normal line NL is a line which is orthogonal to the tangential line of the second surface 142 at the arbitrary point AP and which extends from the arbitrary point AP toward the outside of the insulating layer 140 (+Z-axis direction). The parallel line PL is a line which extends from the arbitrary point AP toward the connection terminal 132 in parallel to the first surface 141. In the present embodiment, the parallel line PL is a line along the X axis. As viewed on the Z-X plane, the angle θ which is larger than 0° but smaller than 90° is formed between the normal line NL and the parallel line PL at the arbitrary point AP on the second surface 142.

In the present embodiment, the second surface 142 is composed of a curved surface. In the present embodiment, a portion of the second surface 142 located on the side toward the first surface 141 is a curved surface which is convex toward the outside of the insulating layer 140 (+Z-axis direction), and a portion of the second surface 142 located on the side toward the connection terminal 132 is a curved surface which is concave toward the interior of the insulating layer 140 (−Z-axis direction).

In the present embodiment, the surface roughness of the second surface 142 is greater than that of the first surface 141. In the present embodiment, the center line average roughness Ra of the second surface 142 is 0.06 to 0.8 μm (micrometer), and the ten point average roughness Rz of the second surface 142 is 1.0 to 9.0 μm. In contrast to such surface roughness of the second surface 142, the center line average roughness Ra of the first surface 141 is 0.02 to 0.25 μm, and the ten point average roughness Rz of the first surface 141 is 0.6 to 5.0 μm.

In the present embodiment, the insulating layer 140 is formed through application of a photo-setting-type insulating resin on the base layer 120 with the conductor layer 130 formed thereon, and subsequent exposure and development. The opening 150 of the insulating layer 140 corresponds to a portion masked during the exposure, and an unset portion is washed away during the development, whereby the second surface 142 of the insulating layer 140 is formed. As described above, the first surface 141 and the second surface 142 of the insulating layer 140 are formed unitarily as portions which constitute a single layer. In the present embodiment, the shape and surface roughness of the second surface 142 are realized by adjusting the quality of the photo-setting-type insulating resin; the shape of a mask used for exposure; and the strength, irradiation time, and irradiation angle of irradiation light used for exposure.

When the semiconductor chip 20 is mounted on the wiring substrate 10, as shown in FIG. 2, the connection terminal 132 is soldered to the connection terminal 232 of the semiconductor chip 20, and an underfill 30 is filled into a gap which is formed between the semiconductor chip 20 and the second surface 142 within the opening 150.

According to the above-described first embodiment, the underfill 30 is guided toward the connection terminal 132 by various parts of the second surface 142, whereby the flow of the underfill 30 can be stabilized. As a result, it is possible to suppress formation of voids due to failure to completely fill the underfill 30.

Also, since the second surface 142 is composed of the curved surface, as compared with the case where the second surface 142 is composed of a flat surface, the surface area of the second surface 142 which comes into contact with the underfill 30 increases, whereby the degree of adhesion between the second surface 142 and the underfill 30 can be increased. Also, as compared with the case where the second surface 142 is composed of a flat surface, the stress of the insulating layer 140 due to hardening of the underfill 30 decreases. Therefore, cracking of the insulating layer 140 can be suppressed.

B. Second Embodiment

Figure 3:
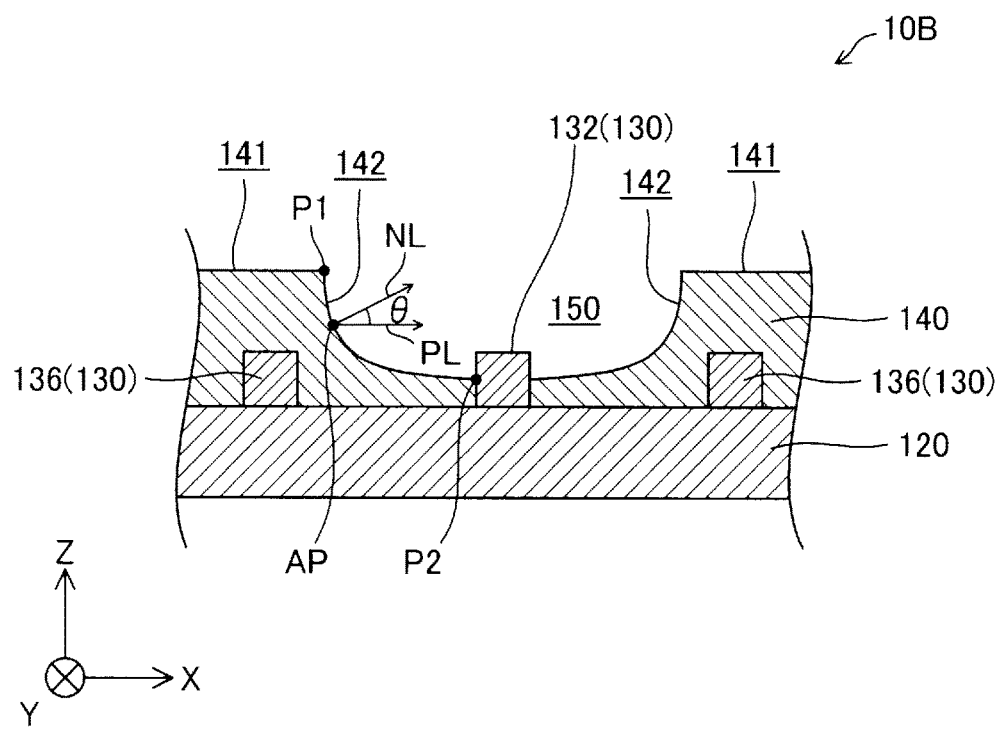
FIG. 3 Partial cross-sectional view schematically showing the structure of a wiring substrate according to a second embodiment.

FIG. 3 is a partial cross-sectional view schematically showing the structure of a wiring substrate 10B according to a second embodiment. In the description of the second embodiment, structural components identical to those of the first embodiment are denoted by the same reference numerals, and their description will not be repeated.

The wiring substrate 10B of the second embodiment is identical to the wiring substrate 10 of the first embodiment except for the shape of the second surface 142. The second surface 142 of the second embodiment is the same as the second surface 142 of the first embodiment except the point that the second surface 142 of the second embodiment is composed of a curved surface which extends from the connection point P1 to the connection point P2 and is concave toward the interior of the insulating layer 140 (−Z-axis direction). In the second embodiment, as viewed on the Z-X plane, an angle θ which is larger than 0° but smaller than 90° is formed between the normal line NL and the parallel line PL at the arbitrary point AP on the second surface 142, as in the first embodiment. In the second embodiment, the angle θ increases as the arbitrary point AP moves from the connection point P1 toward the connection point P2.

According to the above-described second embodiment, like the first embodiment, it is possible to suppress formation of voids due to failure to completely fill the underfill 30. Also, since the second surface 142 is composed of a curved surface, like the first embodiment, the degree of adhesion between the second surface 142 and the underfill 30 can be increased. Also, since the second surface 142 is composed of the curved surface, cracking of the insulating layer 140 can be suppressed.

C. Third Embodiment

Figure 4:
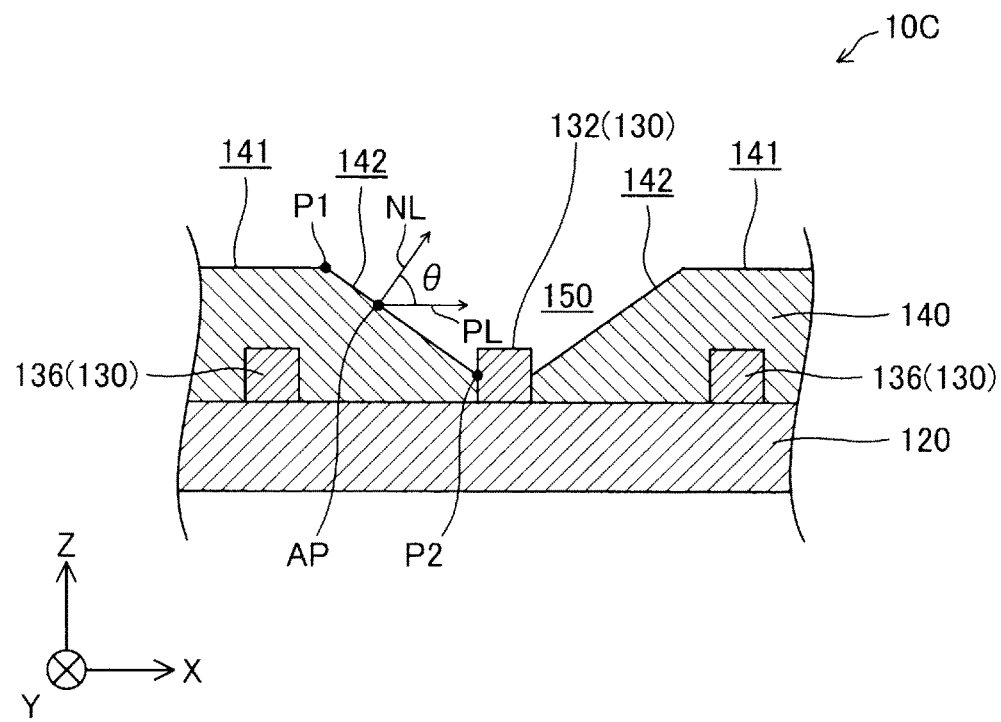
FIG. 4 Partial cross-sectional view schematically showing the structure of a wiring substrate according to a third embodiment.

FIG. 4 is a partial cross-sectional view schematically showing the structure of a wiring substrate 10C according to a third embodiment. In the description of the third embodiment, structural components identical to those of the first embodiment are denoted by the same reference numerals, and their description will not be repeated.

The wiring substrate 10C of the third embodiment is identical to the wiring substrate 10 of the first embodiment except for the shape of the second surface 142. The second surface 142 of the third embodiment is the same as the second surface 142 of the first embodiment except the point that the second surface 142 of the third embodiment is composed of a flat surface. In the third embodiment, the second surface 142 is composed of the flat surface which extends from the connection point P1 to the connection point P2.

In the third embodiment, as viewed on the Z-X plane, an angle θ which is larger than 0° but smaller than 90° is formed between the parallel line PL and the normal line NL at the arbitrary point AP on the second surface 142, as in the first embodiment. In the third embodiment, the angle θ is constant irrespective of the position of the arbitrary point AP between the connection point P1 and the connection point P2.

According to the above-described third embodiment, like the first embodiment, it is possible to suppress formation of voids due to failure to completely fill the underfill 30. Also, as compared with the case where the second surface 142 is composed of a curved surface, the distance over which the underfill 30 flows on the second surface 142 becomes shorter. Therefore, the time required for filling the underfill 30 can be shortened.

D. Fourth Embodiment

Figure 5:
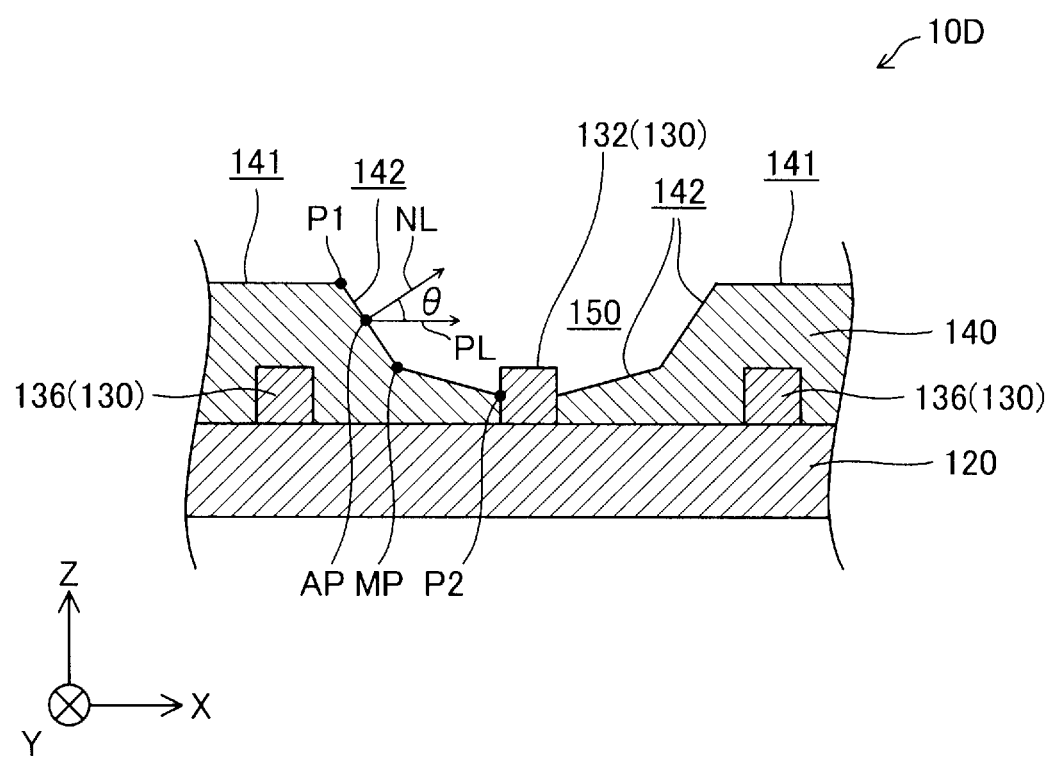
FIG. 5 Partial cross-sectional view schematically showing the structure of a wiring substrate according to a fourth embodiment.

FIG. 5 is a partial cross-sectional view schematically showing the structure of a wiring substrate 10D according to a fourth embodiment. In the description of the fourth embodiment, structural components identical to those of the first embodiment are denoted by the same reference numerals, and their description will not be repeated.

The wiring substrate 10D of the fourth embodiment is identical to the wiring substrate 10 of the first embodiment except for the shape of the second surface 142. The second surface 142 of the fourth embodiment is the same as the second surface 142 of the first embodiment except the point that the second surface 142 of the fourth embodiment is composed of flat surfaces. In the fourth embodiment, the second surface 142 is composed of a flat surface which extends from the connection point P1 to a midpoint MP and a flat surface which extends from the midpoint MP to the connection point P2. The midpoint MP is a point on the second surface 142 which is located between the connection points P1 and P2.

In the fourth embodiment, as viewed on the Z-X plane, an angle θ which is larger than 0° but smaller than 90° is formed between the parallel line PL and the normal line NL at the arbitrary point AP on the second surface 142, as in the first embodiment. In the fourth embodiment, the angle θ measured at an arbitrary point AP between the midpoint MP and the connection point P2 is greater than the angle θ measured at an arbitrary point AP between the midpoint MP and the connection point P1.

According to the above-described fourth embodiment, like the first embodiment, it is possible to suppress formation of voids due to failure to completely fill the underfill 30. Also, as compared with the case where the second surface 142 is composed of a curved surface, the distance over which the underfill 30 flows on the second surface 142 becomes shorter. Therefore, the time required for filling the underfill 30 can be shortened.

E. Other Embodiments

The present invention is not limited to the above-described embodiments, examples, and modifications, and can be realized in various configurations without departing from the scope of the invention. For example, the technical features in the embodiments, examples, and modifications which correspond to the technical features of the modes described in the SUMMARY OF THE INVENTION section can be freely combined or replaced with other features so as to partially or completely solve the above-described problems or so as to partially or completely yield the above-described effects. Also, a technical feature(s) may be freely omitted unless the technical feature(s) is described in the present specification as an essential feature(s).

The shape of the second surface 142 may be changed freely so long as the relation 0°<θ<90° is satisfied. For example, the second surface 142 may be a curved surface having three or more inflection points between the connection point P1 and the connection point P2. Alternatively, the second surface 142 may be composed of three or more flat surfaces which are located between the connection point P1 and the connection point P2 and which differ in the value of the angle θ. Alternatively, the second surface 142 may be composed of a curved surface (s) and a flat surface(s).

DESCRIPTION OF REFERENCE NUMERALS AND SYMBOLS 10, 10B, 10C, 10D: wiring substrate
20: semiconductor chip
30: underfill
120: base layer
130: conductor layer
132: connection terminal
136: internal wiring
140: insulating layer
141: first surface
142: second surface
150: opening
232: connection terminal
SD: solder
P1: connection point
P2: connection point
MP: midpoint
AP: arbitrary point
NL: normal line
PL: parallel line

The invention claimed is:

1. A wiring substrate comprising:
   an insulating base layer;
   an insulating layer laminated on the base layer, the insulating layer having a first surface with an opening, and a second surface located within the opening and being concave toward the base layer in relation to the first surface; and
   an electrically conductive connection terminal projecting from the insulating layer inside the opening, wherein
   the second surface extends from the first surface to the connection terminal inside the opening;
   on a cut surface which is a flat surface extending along a lamination direction in which the insulating layer is laminated on the base layer, an angle which is larger than 0° but smaller than 90° is formed between a normal line extending outward from an arbitrary point on the second surface and a parallel line extending from the arbitrary point toward the connection terminal in parallel to the first surface, with the angle larger than 0° but smaller than 90° at all points on the second surface; and
   the second surface has a surface roughness greater than that of the first surface.

2. A wiring substrate according to claim 1, wherein the second surface is composed of a curved surface.

3. A wiring substrate according to claim 1, wherein the second surface is composed of a flat surface.

* * * * *